United States Patent
Nauleau et al.

(10) Patent No.: US 7,164,310 B1
(45) Date of Patent: Jan. 16, 2007

(54) SYSTEMS AND APPARATUS FOR DIGITAL CONTROL OF BIAS FOR TRANSISTORS

(75) Inventors: Jean-Luc Nauleau, Los Gatos, CA (US); Janos Erdelyi, Dunakeszi (HU); William H. McCalpin, Boulder, CO (US)

(73) Assignee: Integration Associates Inc., Mountain View, CA (US)

( * ) Notice: Subject to any disclaimer, the term of this patent is extended or adjusted under 35 U.S.C. 154(b) by 609 days.

(21) Appl. No.: 10/121,570

(22) Filed: Apr. 12, 2002

Related U.S. Application Data

(60) Provisional application No. 60/283,413, filed on Apr. 12, 2001, provisional application No. 60/352,903, filed on Jan. 28, 2002.

(51) Int. Cl.
*G05F 1/10* (2006.01)
(52) U.S. Cl. ....................................... 327/540; 327/541
(58) Field of Classification Search ................ 327/538, 327/134, 530, 419, 540, 541, 542, 543, 313, 327/323; 323/315, 316
See application file for complete search history.

(56) References Cited

U.S. PATENT DOCUMENTS

| 4,090,136 | A | * | 5/1978 | Magnien et al. ............. 375/249 |
| 4,373,394 | A | * | 2/1983 | Renzel et al. ................ 327/134 |
| 4,670,719 | A | * | 6/1987 | Sakurai ....................... 330/137 |
| 5,710,519 | A |   | 1/1998 | McCalpin et al. |
| 6,198,313 | B1 | * | 3/2001 | Poucher et al. ................ 327/91 |
| 6,441,600 | B1 | * | 8/2002 | Atallah et al. ........... 324/76.11 |
| 6,472,897 | B1 | * | 10/2002 | Shyr et al. ................... 324/765 |
| 6,492,798 | B1 | * | 12/2002 | Sunter ..................... 324/76.15 |
| 6,509,771 | B1 | * | 1/2003 | Atallah et al. ............... 327/175 |

* cited by examiner

*Primary Examiner*—Linh My Nguyen
(74) *Attorney, Agent, or Firm*—Vernon W. Francissen; Francissen Patent Law, P.C.

(57) ABSTRACT

The present invention is directed toward a system and apparatus for digitally controlling a bias control signal for at least one transistor. The present invention provides for software writable registers that control the bias control signal. The present invention further provides for the bias control signal to be temperature compensated based upon a temperature signal and a temperature profile stored in software writable registers. The present invention further provides for software control of the initialization and configuration of the bias control signal through stored program control of the values in the software writable registers.

4 Claims, 5 Drawing Sheets

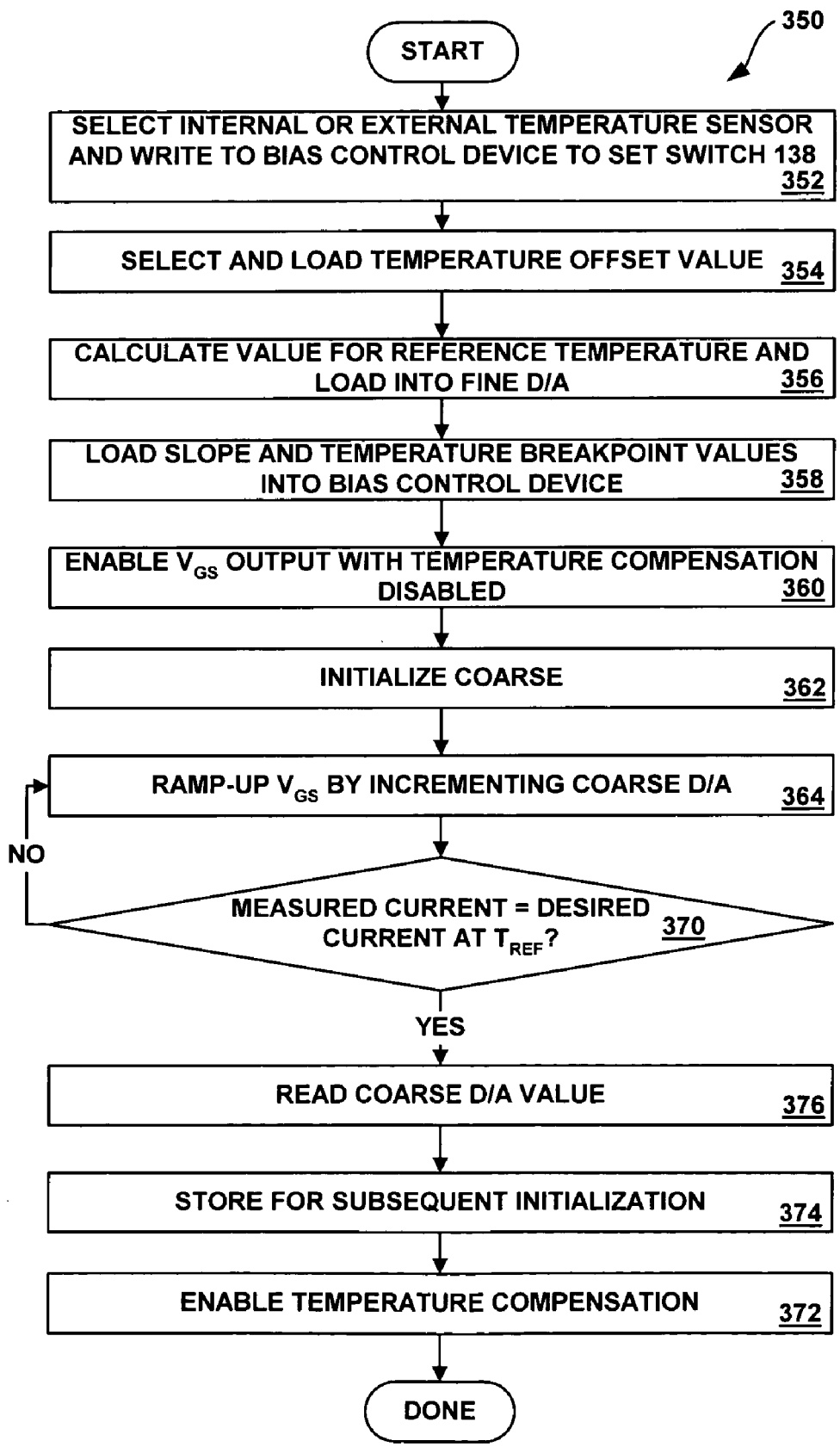

SYSTEMS AND APPARATUS FOR DIGITAL CONTROL OF BIAS FOR TRANSISTORS

CROSS-REFERENCES TO RELATED APPLICATIONS

This application claims priority to co-pending provisional patent application No. 60/283,413 filed Apr. 12, 2001 and co-pending provisional patent application No. 60/352,903 filed Jan. 28, 2002, both of which are incorporated by reference in their entirety for all purposes.

FIELD OF THE INVENTION

The present invention relates to power amplifiers. More specifically, it relates to a method and apparatus for digital control of biasing for power amplifiers.

BACKGROUND OF THE INVENTION

Many systems, such as wireless telephone base stations, employ multiple power transistors, such as LDMOS (Laterally Diffused MOS) transistors, to amplify a signal for transmission, e.g. a radio frequency (RF) signal. Typically, the biasing for the power transistors is implemented using discrete devices that must be hand tuned for the particular application and the characteristics of the particular transistors employed. This is an expensive approach both in terms of parts costs and labor costs. In addition, the resulting bias level is typically either fixed for the lifetime of the system or must be retuned by hand to account for the effects of aging and temperature. U.S. Pat. No. 5,710,519 describes an example of a prior art device and is hereby incorporated by reference for all purposes.

SUMMARY OF THE INVENTION

An embodiment in accordance with the present invention of a bias control device for biasing at least one transistor, includes a transistor bias control unit having a first register for storing a coarse bias control value, where the first register is software writable, a first digital to analog converter (DAC) coupled to the first register for converting the coarse bias control value to produce a first analog bias signal, and a buffer coupled to the first DAC for producing a bias control signal. A further refinement of this embodiment further includes a temperature compensator for receiving a temperature signal and, responsive thereto, generating a fine bias control value, a second DAC coupled to the temperature compensator for converting the fine bias control value to produce a second analog bias signal, and a summer interposed the buffer and the first and second DACs for summing the first and second analog bias signals for output to the buffer. In another refinement, the temperature compensator includes a slope register for storing at least a first slope value, where the slope register is software writable and a logic circuit coupled to the slope register, where the logic circuit receives the temperature signal and generates the fine bias control value using the first slope value. In still another refinement of this embodiment, the temperature compensator further includes a temperature breakpoint register for storing a temperature breakpoint value, where the temperature breakpoint register is software writable, the slope register is further configured to store a second slope value, and the logic circuit is coupled to the temperature breakpoint register and is further configured to generate the fine bias control value using the second slope value when the temperature signal exceeds the temperature breakpoint value. In an additional refinement, the transistor bias control unit further includes a switch controlled by a software writable register, where the switch is configured to select between an internally generated temperature signal and an externally provided temperature signal for input to the temperature compensator. In another additional refinement, the bias control device further includes a local control bus coupled to at least one transistor bias control unit and a digital interface device coupled to the local control bus and configured to interface with a system bus, where the digital interface device is further configured to receive a software message from the system bus and, responsive thereto, write data from the software message to one of the software writable registers designated in the software message.

In an embodiment of a bias power system, according to the present invention, the system is composed of a local control bus and a bias control device has a first register for storing a coarse bias control value, where the first register is software writable, a first digital to analog converter (DAC) coupled to the first register for converting the coarse bias control value to produce a first analog bias signal, and a buffer coupled to the first DAC for producing a bias control signal, where the bias control device is coupled to the local control bus. A controller is coupled to a memory and has a first interface for communicating with the local control bus, where the controller is configured to write the coarse bias control value to the first register of the bias control device under the control of a program stored in the memory. In a refinement of this embodiment, the controller is further configured to retrieve the coarse bias control value from memory in order to write it to the first register of the bias control device. In a further refinement of this embodiment, the controller is further configured to write the coarse bias control value to the first register responsive to initialization. In still a further refinement, the controller is configured to initialize the coarse bias control value in the first register to a first value responsive to initialization and gradually increment the coarse bias control value. In still another refinement of this embodiment, the bias control device further includes a temperature compensator for receiving a temperature signal and, responsive thereto, generating a fine bias control value, a second DAC coupled to the temperature compensator for converting the fine bias control value to produce a second analog bias signal, and a summer interposed the buffer and the first and second DACs for summing the first and second analog bias signals for output to the buffer, where the bias control device also includes a slope register for storing at least a first slope value, where the slope register is software writable, and a logic circuit coupled to the slope register, where the logic circuit receives the temperature signal and generates the fine bias control value using the first slope value. In this refinement, the controller is further configured to write the first slope value to the slope register of the bias control device under the control of a program stored in the memory. In an additional refinement of this embodiment, the controller is further configured to receive a software message that includes the first slope value, where the first slope value corresponds to a particular type of transistor and load the first slope value into the slope register.

BRIEF DESCRIPTION OF DRAWINGS

The present invention is described herein with reference to the accompanying drawings, in which like numerals designate corresponding parts in the figures, wherein:

FIG. 5 is a flow control diagram illustrating an embodiment of a process for initial current setup in accordance with the present invention.

DETAILED DESCRIPTION OF PREFERRED EMBODIMENTS

The present invention is directed toward a method and apparatus for digital control of biasing for power amplifiers, whereby the biasing of a transistor may be automatically adjusted. It is useful to automatically adjust biasing to meet the requirements of a variety of applications, such as for reduced power or to accommodate pre-distortion of the amplified signal. Similarly, the biasing may be automatically adjusted to adapt to changes in the characteristics of the transistors, such as due to temperature changes or aging.

In one embodiment of the present invention, a bus control device according to the present invention is configured to generate temperature compensated gate bias voltage for LDMOS transistors used in RF power amplifiers. In this embodiment, a number of transistors controlled by the bus control device can each have different parameters programmed via a single interface bus, such as a single-wire serial digital interface bus. Furthermore, in this embodiment of the present invention, a typical system bus, such as an I²C bus, may control a plurality of bias control devices according to the present invention.

Figure 1:
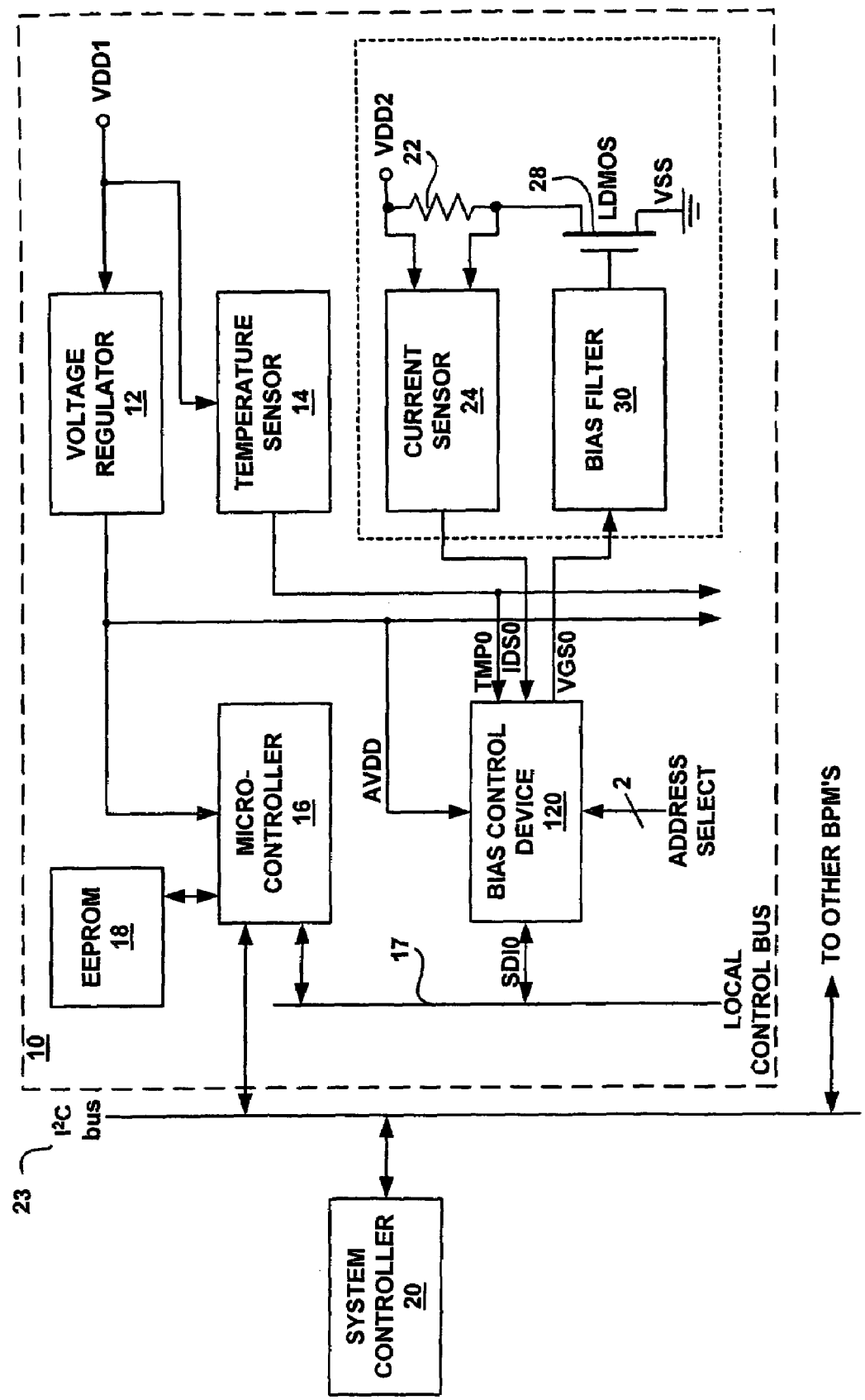
FIG. 1 is a functional block diagram illustrating a system having a base power module that includes a bias control device in accordance with one embodiment of the present invention.

FIG. 1 illustrates an embodiment of a bias power module (BPM) 10 according to one embodiment of the present invention for controlling the biasing voltage of at least one transistor 28, which is an LDMOS transistor in this example. BPM 10 includes a voltage regulator 12 that is coupled to a power supply terminal VDD1 that provides a power supply voltage, which, in this embodiment, is +8 volts (V). Voltage regulator also receives a ground voltage level not shown and outputs a regulated supply voltage that is provided to operate other components of BPM 10, such as micro-controller 16, electrically erasable programmable read-only memory (EEPROM) 18, temperature sensor 14, and bias control device 120. Temperature sensor 14 provides an output signal TMP0 that corresponds to the temperature of BPM 10, which is input to bias control device 120.

In BPM 10, functionality is generally divided between micro-controller 16, which provides digital control functions, and bias control device 120, which provides analog biasing control signals. Micro-controller 16 is coupled to a system bus 23 via a first communication interface through which it receives data, such as set-up configuration data and program data, and transmits status information, such as failure or over-temperature signals, from and to system controller 20. System controller is typically a system control module for controlling a system, such as a power amplifier subsystem for a base station, or a test control system for controlling and configuring a system during a test process.

One or more BPMs may be coupled to a system controller 20 via a system bus 23, which may be an I²C bus as shown in this embodiment. In some embodiments, system controller 20 is capable of transferring set-up configuration or program information to the BPMs via system bus 23 and receiving status information, such as failure or over-temperature signals, from the BPMs via system bus 23.

Micro-controller 16 has a second communication interface through which it communicates with at least one bias control device (BCD) 120 via a local control bus 17. In one embodiment of the present invention, local control bus 17 is a serial input/output (I/O) bus (SDIO) that transfers digital control and status data between micro-controller 16 and bias control device 120 in a serial format. Micro-controller 16 is coupled to EEPROM 18 that stores set-up configuration data used to configure the biasing current provided by BCD 120 to bias transistor 28. The configuration data can also include temperature compensation curve data and breakpoint data relating to inflection points in the compensation curve data and aging data for adjusting the bias signal for a transistor as it ages. EEPROM 18 may also store performance measurement data obtained from BCD 120 to track the performance of the transistors controlled by the BCD. Note that EEPROM 18 may be internal to micro-controller 16 or may be an external EEPROM device.

Further, EEPROM 18 may store the program data for controlling micro-controller 16. The programs stored in EEPROM 18 provides for setting the biasing signal for a transistor driven by BCD 120. However, the stored program may also be configured to collect and store performance data relating to the performance of the transistor over time and the temperature readings over time obtained from temperature sensor 14 through BCD 120. The stored program can also provide for a variety of additional features, such as selective power-down or reduced power, which will be discussed in greater detail below.

BCD 120 provides a bias signal for a power transistor under control of micro-controller 16. Power transistor 28 is coupled in series with a current sense resistor 22 between a power terminal VDD2, which, in this embodiment, provides +28 V voltage level, and a power terminal VSS, which provides a ground voltage level. The sense resistor 22, which is typically on the order of a 0.1 ohm (Ω) resistor, provides a voltage drop due to the drain current of transistor 28 that is input to current sensor 24. Current sensor 24 converts the voltage sensed across resistor 22 into a current level signal IDS0 that is input to BCD 120. BCD 120 generates a bias control signal VGS0 that is input to bias filter 30, which filters VGS0 and uses the filtered signal to drive the gate of LDMOS transistor 28. Other types of transistors other than LDMOS, such as bi-polar transistors, may also be controlled in accordance with the present invention.

During initial setup of the BCD 120, the drain current of transistor 28 is monitored by digitizing the IDS0 signal output by current sensor 24, which, in this embodiment, is an external current-to-voltage converter. The current values can be read out to micro-controller 16 via the local interface bus 17. The operational gate bias voltage signal VGS0 may be determined by measuring ambient temperature using a temperature sensor that is either external to BCD 120, e.g. temperature sensor 14, or internal to BCD 120. VGS0 is then determined using a piecewise linear approximation of the gate voltage versus temperature characteristic. Two different slopes and a temperature breakpoint may be set for each LDMOS.

Figure 2:
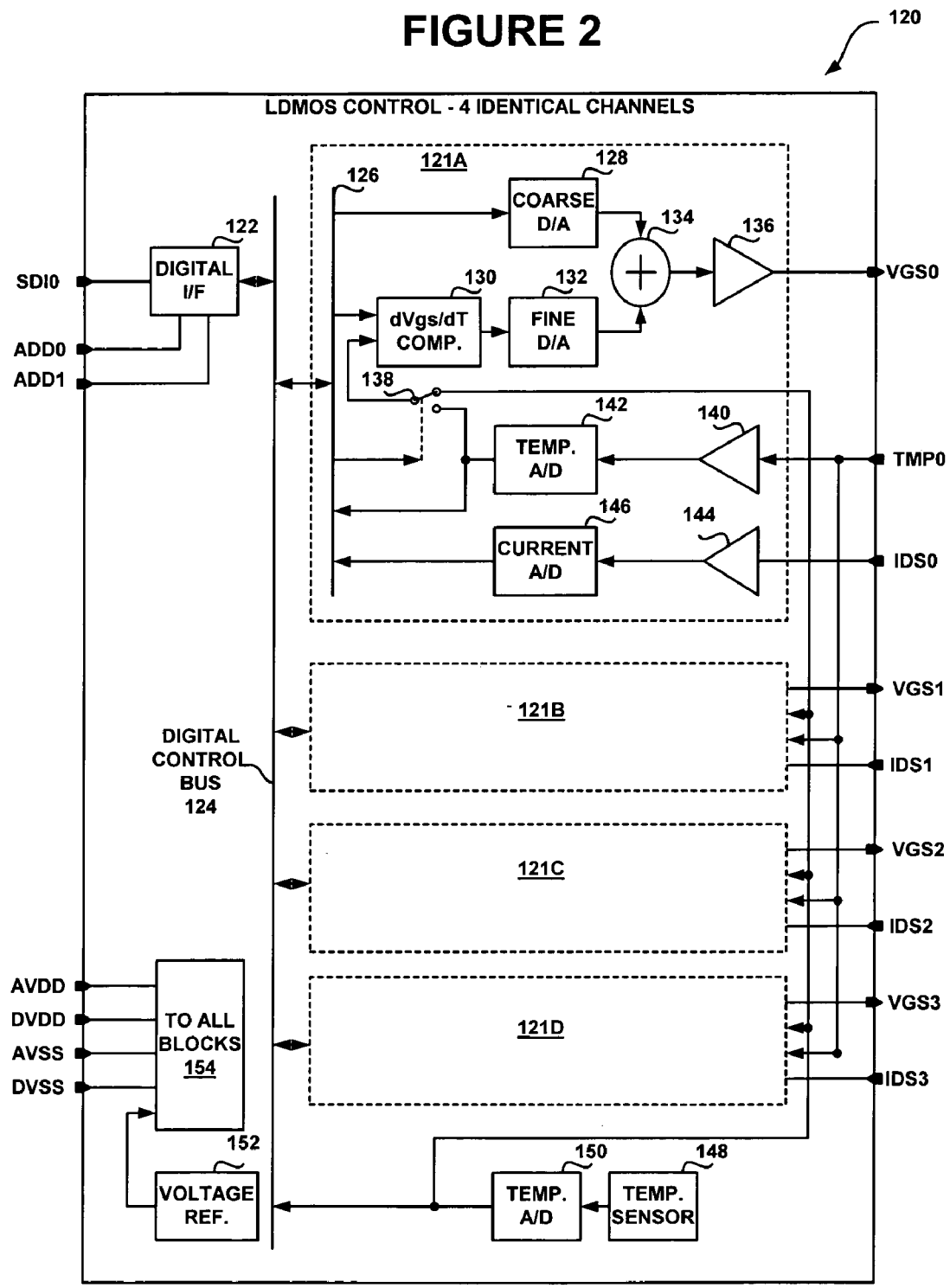
FIG. 2 is a functional block diagram illustrating an embodiment of a bias control device in accordance with one embodiment of the present invention.

As noted above, the present invention may include both an internal temperature sensor and an interface to an external sensor 14, which may be a temperature-to-voltage converter. An offset can be programmed into the temperature curve to represent the temperature difference between the temperature at the position of the LDMOS and the temperature at the sensor location. The measured temperature value can also be read out to the micro-controller 16. The present invention is directed toward a device that permits the bias level for the power transistors to be digitally set by a bias control device. FIG. 2 illustrates one embodiment of bias control device 120 according to the present invention for driving up to four transistors. In this embodiment, BCD 120 includes a digital interface 122 that communicates with micro-controller 16 via serial data I/O bus 17. Digital interface 122 includes two address input lines ADD0 and ADD1 that receive an address signal that selects one of the four transistor bias units 121A–D. Digital interface 122 transfers data to and from each of the transistor bias units 121A–D via digital control bus 124. While four transistor bias units are shown, the number may be varied based upon the desired number of transistors to be controlled and the number of pins on the resulting die containing the circuit of BCD 120. For example, two address input lines are required to address four transistor bias units, while three address lines would be required to address up to eight transistor bias units.

BCD 120 also receives up to four power supply terminals. Analog power supply terminals AVDD and AVSS can receive a first power supply potential while digital power supply terminals DVDD and DVSS can receive a second power supply potential. This is useful where the logic levels of local control bus 17 are different from the voltage levels used to operate the analog portions of the circuit of BCD 120. A temperature stabilized voltage reference 152 provides a stabilized reference voltage level to the circuit of BCD 120. As noted above, BCD 120 may utilize external temperature sensors, which input a signal the corresponds to the temperature via inputs TMP0-3, or an internal temperature sensor 148, which may be provided on the BCD integrated circuit. Temperature sensor 148 typically generates a voltage signal corresponding to the temperature that is converted to a digital value using temperature analog-to-digital (A/D) converter 150. The digital value of the temperature A/D is output to digital control bus 124 and each of the four transistor bias units 121A–D.

Transistor bias unit 121A is one embodiment of a transistor bias unit in accordance with the present invention. Transistor bias unit 121A includes coarse digital-to-analog (D/A) converter 128 for the coarse adjustment of the bias output signal VGS0. D/A converter 128 includes an internal register for holding a coarse adjustment value. A temperature compensator 130 is included that receives a temperature value from either an external temperature sensor via TMP0 or internal temperature sensor 148. In the embodiment of FIG. 2, temperature compensator 130 is a digital device. However, one of ordinary skill in the art will readily recognize that the present invention may be adapted to utilized an analog temperature compensator. The output of temperature compensator 130 is input to fine D/A converter 132, which converts the digital output from the compensator into an analog signal. A summer 134 adds the signals output by coarse D/A 128 and fine D/A 132 and outputs the result through buffer 136 as the bias control signal VGS0.

An external temperature signal is received at TMP0, buffered through buffer 140, and input to temperature A/D converter 142 for conversion into a digital value that is input to switch 138. Switch 138 selects between the temperature values output by temperature A/D 142 and 150 based on a switch control signal received through digital interface 122. Typically, when transistor 28 is located at a significant distance from BCD 120, an external temperature sensor 14 is positioned near transistor 28 and used to provide temperature signal TMP0 to BCD 120. If BCD 120 and transistor 28 are located near one another, then internal temperature sensor 148 may be suitable to detect the operating temperature of the transistor 28. In addition, an offset factor may be incorporated into the value that is stored in coarse D/A 128 to account for the distance between transistor 28 and the temperature sensor used to detect the operating temperature of the transistor.

In BCD 120, the micro-controller 16 of FIG. 1 inputs a digital value through digital interface 122 to transistor bias units 121A that drives coarse D/A converter (DAC) 128 that generates bias output signal VGS0 for control of transistor 28. In the present invention, coarse DAC 128 provides a coarse bias level for the bias output signal and fine DAC 132 fine tunes the magnitude of the bias signal based on a feedback signal, e.g. TMP0. The output of the coarse and fine DACs 128 and 132 are summed with the output from the gross tuning DAC to generate the bias output signal VGS0.

Figure 3:
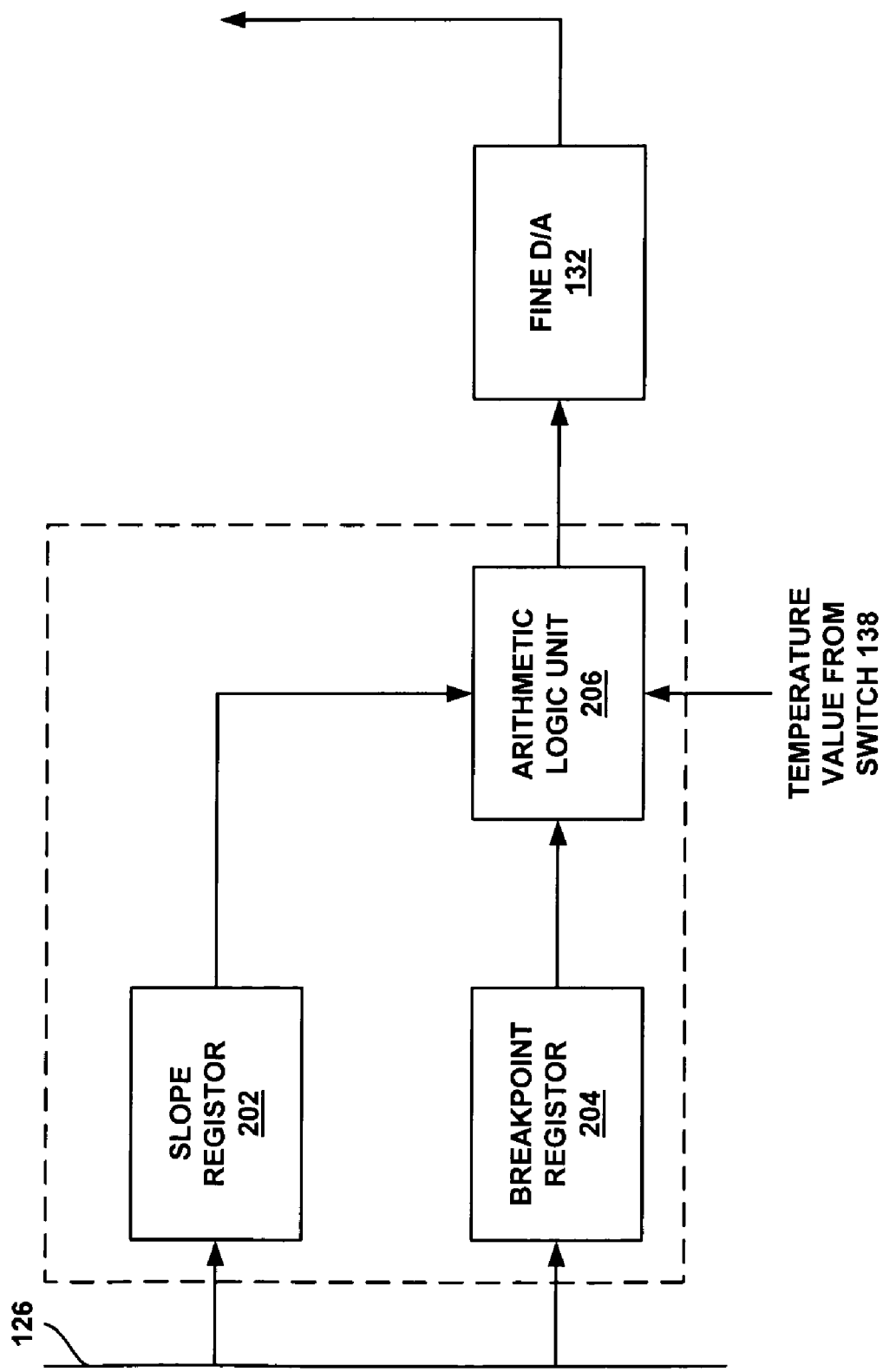
FIG. 3 is a functional block diagram illustrating an embodiment of the temperature compensator of FIG. 2.

FIG. 3 illustrates one embodiment of a digital embodiment of temperature compensator 130 of FIG. 2 in accordance with the present invention. In this digital embodiment, slope register 202 stores at least one slope value describing the slope of a temperature profile for a transistor. This slope is written to slope register 202 by micro-controller 16 through digital interface 122 during set-up of the BPM 120. Arithmetic logic unit (ALU) 206 receives the slope value from slope register 202 and a temperature value from switch 138 of FIG. 2. ALU 206 generates a fine adjustment value to adjust the biasing signal to the transistor based on the temperature value and the slope, where the fine adjustment value is output to fine D/A converter 132 of FIG. 2.

Figure 4:
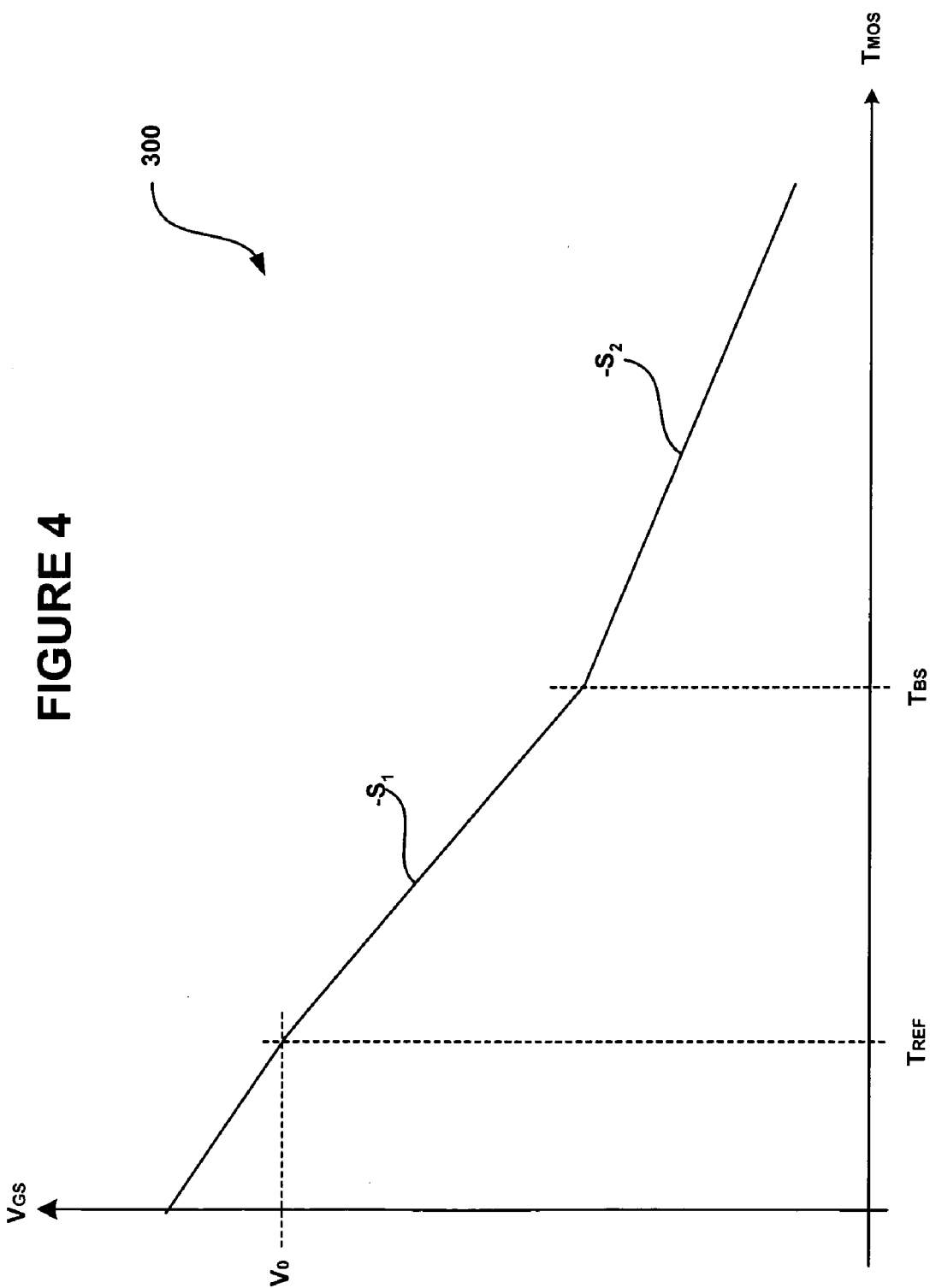
FIG. 4 is a graph illustrating an example of a temperature compensation function for the temperature compensator of FIG. 2.

The embodiment of FIG. 3 also includes an optional breakpoint register 204, which may be written with a breakpoint value TBS by micro-controller 16 through digital interface 122. In this embodiment, micro-controller 16 writes both a first and a second slope value, S1 and S2, respectively, to slope register 202, where the second slope value S2 represents the temperature compensation slope to be used when the temperature rises above the level represented by the value in the breakpoint register 204. FIG. 4 is a graph illustrating an example of the resulting temperature TMOS to control voltage VGS curve utilizing a breakpoint value TBS and two slopes S1 and S2. When the temperature value TMOS received from switch 138 is below the breakpoint value TBS stored in register 204, ALU 206 utilizes the first slope S1 from slope register 202 to calculate the temperature compensation value to output to fine D/A converter 132. When the temperature value TMOS received from switch 138 reaches the breakpoint value TBS stored in register 204, ALU 206 utilizes the second slope S2 from slope register 202 to calculate the temperature compensation value to output to fine D/A converter 132.

Returning to digital interface 122 of FIG. 2, the interface is provided to permit a controller, such as micro-controller 16, to write data to software writable registers in the transistor bias control units 121A–D and also to read data from BCD 120 and units 121A–D. For example, as discussed above, units 121A–D include software writable registers for coarse D/A 128 and a control register or flip-flop for switch 138 as well as slope register 202 and breakpoint register 204 for compensator 130. In addition, fine D/A 132 may include a software writable register for initialization purposes. Further, many of these registers can be software readable so that their values can be read out to controller 16 for processing, analysis, or storage. Digital interface 122 may also provide read access for reading the output from temperature A/D converter 150 of BCD 120 and temperature A/D converter 142 and current A/D converter 146 of each of transistor bias control units 121A–D.

Digital interface 122 receives software messages via the SDIO interface. The type of message determines which register is accessed for a write or read operation. The value input to the address lines ADD0 and ADD1 indicates, where applicable, which transistor bias control unit 121A–D to access. For example, interface 122 may receive a type of message that indicates a write operation to coarse D/A 128 and includes the data to be written where the value of ADD0 and ADD1 is "00", indicating transistor bias control unit 121A, that will cause interface 122 to write the value received in the message to the register of coarse D/A converter 128 in unit 121A through control bus 124. Similarly, interface 122 may receive a type of message indicating a query operation of temperature A/D 142 where the value of ADD0 and ADD1 is "10", indicating transistor bias control unit 121C, that will cause interface 122 to read the value from temperature A/D 142 of unit 121C through control bus 124, format a reply message that includes the value read, and transmit the reply message via SDIO. As one of ordinary skill in the art will readily appreciate, other types of messages designate other operations. Further note that it may be possible to eliminate digital interface 122 if BCD 120 has only one transistor bias control unit 121A, such that it is unnecessary to have interface 122 to differentiate between transistor bias control units. In such an embodiment, the architecture of BCD 120 must permit controller 16 to directly access the registers of the BCD.

One of ordinary skill will readily recognize that other embodiments may include additional features without departing from the teachings of the present invention. For example, the present invention may be adapted to utilize additional slopes and breakpoints. Another embodiment may include a register for storing an offset value to compensate for a difference between the actual operating temperature of a transistor and the temperature detected by a temperature sensor used to monitor the operating temperature of the transistor. In that case, the ALU may be configured to factor in the offset value in determining the transistor control voltage. Also note that the micro-controller 16 can be programmed to detect the breakpoint temperature by reading the temperature signal from BCD 120 and writing a new bias slope value to the slope register.

Using the present invention, a user is able to program the temperature dependency of a transistor by selecting the bias slope value. For example, an initial slope S1 of 2 mV/degree may be selected with a breakpoint temperature TBS of 70 degrees Celsius selected. When the device temperature reaches 70 degrees, then the breakpoint will trip and the BCD 120 may shift to another selected slope S2, such as 1 mV/degree or 0 mV/degree. Thus, increasing operating temperature TMOS will cause the bias current of the transistor to increase by a different rate.

It is also possible to provide an analog embodiment of temperature compensator 130. For example, an embodiment of an analog temperature compensator may include a bias slope DAC and a temperature breakpoint DAC that each receive a digital value from the micro-controller 16. Each of the bias slope DAC and temperature breakpoint DAC generate an output signal, where the magnitude of the output signal corresponds to the digital value provided by the controller. The output signals for the bias slope DAC and temperature breakpoint DAC are summed and input to a Proportional to Absolute Temperature (PTAT) circuit that responds by outputting a temperature profile signal and a temperature signal. Alternatively, a Negative to Absolute Temperature (NTAT) circuit could be used. The temperature profile signal is then summed with the gross tuning output signal and the fine tuning output signal to generate a bias output signal. The temperature signal may be input to a breakpoint trip enable circuit that generates an output signal that is input to the temperature breakpoint DAC. The bias slope DAC is configured to provide the slope of the output of the PTAT profile, e.g. in terms of mV of magnitude versus temperature as illustrated in the voltage vs. temperature graph of FIG. 4. For example, the temperature curve may be selected based on the operating conditions and the transistor type. The temperature breakpoint DAC can be provided to generate a temperature breakpoint for shifting to a different bias slope.

In still another embodiment, a temperature offset DAC may be provided that is driven by a digital value provided by the controller 16 to produce a temperature offset signal. The temperature offset signal is then summed with the output signals from the gross tuning DAC and fine tuning DAC to generate a bias output signal. This allows the user to shift the horizontal axis of the temperature curve to accommodate differences in temperature between the temperature measuring or sensing point and the point of interest within the power transistor circuit. For example, if these points are physically separate, then there may be a 20 degree temperature difference that can be accounted for using the temperature offset DAC. As noted above, a temperature offset may also be achieved with a digital embodiment of temperature compensator 130.

As noted above, the present invention may be configured to digitally control a plurality of transistors. Returning to FIG. 2, the embodiment of BCD 120 shown permits each bias output signal VGS0-3 to be tuned to the characteristics of the particular transistor controlled by each of transistor bias units 121A–D. In the embodiment shown, a coarse D/A converter 128 is provided in each of the transistor bias units 121A–D, which permits a different temperature compensation profile to be input for each transistor, which is particularly useful where different types of transistors are being drive by the same BCD 120. However, an alternative embodiment of BCD 120 is possible where the BCD drives the same type of transistor and a single coarse D/A converter may be used to provide a basic bias level with fine adjustments being performed by a fine D/A converter for each transistor.

As noted above, the provision of a programmable microcontroller 16 along with BCD 120 in the present invention permits a high level of flexibility. For example, microcontroller 16 can be programmed to perform a bias current initialization process 350, such as that shown in FIG. 5, that limits high initial current transients in the transistor and initializes each transistor bias control unit such that the fine D/A converter 132 is sufficient to adjust the bias control signal VGS0-1 during operation of the transistor. Process 350 may be performed during an initial test and configuration procedure for a power system, in which case system controller 20 may be a test controller that requests microcontroller 16 to perform process 350. Also, process 350 and variants of the process may be performed in response to an initialization event, such as receiving an initialization message from system controller 20 or power-up of BPM 10. At step 352, micro-controller 16 selects either internal temperature sensor 148 or an external temperature sensor input, e.g. TMP0-3, and writes to a register in the transistor bias control unit 121A–D to set switch 138. The temperature sensor selection is made by a user or designer and may be provided by system controller 20 or pre-stored in EEPROM 18. Similarly, at step 354, a temperature offset value may be selected and loaded into the transistor bias control unit 121A–D in some embodiments.

At step 356, a temperature compensation value is calculated for a reference temperature TREF and, in some embodiments, loaded into fine D/A 132. TREF may be read from temperature A/D converter 150 of BCD 120 or from temperature A/D converter 150 of the particular transistor bias control unit 121A–D. Alternatively, TREF may be provided by system controller 20 as a test input. An example of the formula for calculating the temperature compensation value X at this step is as follows: $X/(256-32) = (TREF+40)/(140+16)$, which provides sixteen steps of margin in both directions for fine D/A converter 132. This step sets the value in fine D/A converter 132 so that the converter begins operation at the center of its operational range to allow a maximum range of adjustment during operation. Also, presetting the fine D/A converter in this manner may avoid a power transient during power-up of the transistor when temperature compensation is enabled, as discussed below.

At step 358, the slope and temperature breakpoint values may be loaded into the slope register 202 and breakpoint register 204, respectively, for the particular transistor bias control unit 121A–D of BCD 120. The temperature profile represented by the slope and temperature breakpoint values may be provided by system controller 20 based upon a set profile for transistor 28 selected by the user or designer. Alternatively, the temperature profile may be pre-stored in EEPROM 18.

At step 360, the particular transistor bias control unit 121A–D is enabled to output the bias control signal VGS0-3, respectively, with the temperature compensation function of compensator 130 disabled. The value of coarse D/A converter 128 is then initialized at step 362. To avoid a high current transient at initialization, coarse D/A converter 128 may be initialized to 0 or another low value. Alternatively, converter 128 may be initialized with a value stored in EEPROM 18. At step 364, the bias control signal VGS0-3 is ramped up by incrementing converter 128, if a high current transient is to be avoided. At step 370, the measured current IDS0-3 is compared to the desired current at TREF, where the desired current may be provided by system controller 20 or pre-stored in EEPROM 18. If the measured current does not yet match the desired current, then control flow returns to step 364, where the bias control signal VGS0-3 is increased.

If the measured current does match the desired current, then control flow branches to step 372, where, optionally, the coarse D/A value may be read from the particular transistor bias control unit 121A–D and stored in EEPROM 18 at step 374 for subsequent initialization. Note that this portion of the process may be adapted to derive a temperature offset value by comparing the temperature value measured by the particular transistor bias control unit 121A–D of BCD 120 to an actual value measured during testing.

The provision of a micro-controller, such as micro-controller 16 in one embodiment of the present invention, permits the BPM 10 to be configured to provide a wide array of features. For example, micro-controller 16 may be programmed to periodically read the operating temperature of a transistor as measured by BCD 120. The readings may be stored in EEPROM 18 for later download to system controller 20. This data may be useful for tracking the performance of the power module and, where operating temperature reflects traffic load, such as for a wireless base station, may yield a measurement of traffic over time.

Micro-controller 16 may also be programmed to compensate for aging of transistor 28. As a transistor ages, its performance changes such that the compensation curve shifts over time. Micro-controller 16 may be programmed in a variety of ways to change the temperature profile loaded into slope register 202 and temperature breakpoint register 204 for a particular transistor. Micro-controller 16 may be programmed to change the temperature profile based on the passage of time, e.g. when the transistor has operated for a pre-set number of days, or responsive to a signal from system controller 20. Alternatively, controller 16 may be configured to detect aging of the transistor by reading the measured temperature (TMP0-3 or the value from temperature A/D 150) and measured current IDS0-3 from the corresponding transistor bias control unit 121A–D and changing the temperature profile once the measured performance of the transistor has shifted by a predetermined amount. Controller 16 may also be configured to collect actual operating data in order to establish a temperature compensation profile.

A further function of micro-controller 16 may be to detect and respond to transistor failures. For example, controller 16 may be configured to detect failure of the transistor by reading the measured current IDS0-3 from the corresponding transistor bias control unit 121A–D. If the current drops or increases beyond predetermined ranges, then controller 16 may be configured to disable the transistor by turning off the bias control signal VGS0-3. Controller 16 may also be configured to report the failure to system controller 20, which may be a system control panel, by sending a message through bus 22. Still further, controller 16 can be configured to power-up a transistor to replace a failed transistor.

In addition to reporting failures, controller 16 may be configured with a built-in self test (BIST) for testing all BCDs 120 in BPM 10 and to send a BPM OK message to system controller 20. BIST may be executed periodically or on demand from system controller 20. Controller 16 may also be configured to detect over-temperature conditions by measuring the temperature values from BCD 120 and reporting the condition to system controller 20.

Yet another feature for which micro-controller 16 may be configured is power control. Controller 16 may be configured to disable selected transistors by turning off the bias control signal VGS0-3 to the selected transistors. Alternatively, power consumption may be reduced by lowering the bias control signal VGS0-3 by reducing the value of the coarse D/A converter 128. Reduced power mode may be entered based upon a time of day range detected by the controller 16 or in response to a message from system controller 20. Controller 16 may also be programmed to lower the power based upon lower measured traffic load.

Micro-controller 16 is also capable of selectively configured BCD 120 to adjust bias to accommodate a particular application. For example, it is advantageous for GSM or CDMA wireless base stations to have power amplifiers that pre-distort a signal. Pre-distortion can be obtained by changing the bias of the transistors. Thus, micro-controller 16 can be programmed to configure BCD 120 to bias the transistors in a manner that is preferable for certain applications. In this embodiment, system controller 20 typically signals controller 16 to change the biasing characteristics for a transistor based upon the desired application.

The separation of the controller function of micro-controller 16 from the biasing function of software programmable BCD 120 permits changes to be made to a BPM design without redesigning the BCD circuit. Also, the BCD circuit, because it is digitally adjustable by controller 16, can accommodate a variety of transistor types without redesign of the BCD hardware circuit. Also, a single micro-controller 16 can drive several BCDs 120 coupled to local control bus 17, which results in an easily scalable system.

Because the bias output signals are digitally controlled, they can be automatically adjusted by the micro-controller 16 to account for temperature variations and aging of the transistors over the life of the system. Also, micro-controller 16 may be programmed to perform a built-in self test (BIST) to detect failure or the need to make adjustments to the bias signals. The present invention also allows transistors to be tuned digitally or automatically rather than by hand, which can result in significant savings in testing and trimming costs. The present invention also permits transistors to be powered down during times of activity, e.g. at night, to reduce power consumption and extend transistor life.

By providing a feedback mechanism to the controller, e.g. the bias current values or temperature at the power transistors, the controller may be configured to automatically detect and report failures or changes in operating conditions to a higher level device, such as a DSP (Digital Signal Processor). For example, the controller may be able to detect and report a failed transistor. Also, the controller may collect and concentrate information for referral to the higher level device thereby reducing the number of signal feedback lines that must be provided to the higher level device. For example, the number of signal lines required by a DSP to perform bias current correction, which may typically be on the order of thirty lines, may be reduced to just a few lines by having the controller concentrate the information from the transistors before returning it to the DSP. Normally, a current sensor is needed for each transistor and the signal is returned to the higher level device, which results in many signal lines. By sensing the current level in the LDMOS transistors, e.g. using an Analog to digital converter, a signal may be obtained that represents the current level in the power transistors, which may then be utilized to correct the bias current of the system.

Note that the controller or parts of the controller function discussed above may be fabricated on the same substrate as the power transistors.

The invention is not limited to the precise embodiments shown herein. Therefore, all embodiments that come within the scope and spirit of the following claims and equivalents thereto are claimed as the invention

The invention claimed is:

1. A transistor bias control unit comprising:
   a first digital to analog converter (DAC), including a software writable first register, for converting a coarse bias control value in the first register to produce a first analog bias signal;
   a buffer coupled to the first DAC for producing a bias control signal,
   a temperature compensator for receiving a temperature signal and, responsive thereto, generating a fine bias control value;
   a second DAC coupled to the temperature compensator for converting the fine bias control value to produce a second analog bias signal; and
   a summer interposed the buffer and the first and second DACs for summing the first and second analog bias signals for output to the buffer.

2. The bias control device of claim 1, where the temperature compensator comprises:
   a slope register for storing at least a first slope value, where the slope register is software writable; and
   a logic circuit coupled to the slope register, where the logic circuit receives the temperature signal and generates the fine bias control value using the first slope value.

3. The bias control device of claim 2, where the temperature compensator further includes:
   a temperature breakpoint register for storing a temperature breakpoint value, where the temperature breakpoint register is software writable; and
   where the slope register is further configured to store a second slope value; and
   the logic circuit is coupled to the temperature breakpoint register and is further configured to generate the fine bias control value using the second slope value when the temperature signal exceeds the temperature breakpoint value.

4. The bias control device of claim 1, the transistor bias control unit further including a switch controlled by a software writable register, where the switch is configured to select between an internally generated temperature signal and an externally provided temperature signal for input to the temperature compensator.

* * * * *